United States Patent
Datta et al.

(10) Patent No.: US 7,736,956 B2
(45) Date of Patent: Jun. 15, 2010

(54) LATERAL UNDERCUT OF METAL GATE IN SOI DEVICE

(75) Inventors: Suman Datta, Beaverton, OR (US);
Justin K. Brask, Portland, OR (US);
Jack Kavalieros, Portland, OR (US);
Brian S. Doyle, Portland, OR (US);
Gilbert Dewey, Hillsboro, OR (US);
Mark L. Doczy, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 12/079,587

(22) Filed: Mar. 26, 2008

(65) Prior Publication Data

US 2008/0188041 A1   Aug. 7, 2008

Related U.S. Application Data

(62) Division of application No. 11/207,051, filed on Aug. 17, 2005, now Pat. No. 7,402,875.

(51) Int. Cl.
*H01L 29/72* (2006.01)
(52) U.S. Cl. ............ 438/151; 438/182; 438/691; 438/701; 438/713; 438/754
(58) Field of Classification Search ........ 438/151, 438/182, 691, 701, 713, 754
See application file for complete search history.

(56) References Cited

U.S. PATENT DOCUMENTS

| | | | |
|---|---|---|---|
| 3,387,820 A | 6/1968 | Sanderfer et al. | |
| 4,231,149 A | 11/1980 | Chapman et al. | |
| 4,487,652 A | 12/1984 | Almgren | |
| 4,711,701 A | 12/1987 | McLevige | |
| 4,818,715 A | 4/1989 | Chao | |
| 4,905,063 A | 2/1990 | Beltram et al. | |
| 4,906,589 A | 3/1990 | Chao | |
| 4,907,048 A | 3/1990 | Huang | |
| 4,994,873 A | 2/1991 | Madan | |
| 4,996,574 A | 2/1991 | Shirasaki et al. | |
| 5,023,203 A | 6/1991 | Choi | |
| 5,120,666 A | 6/1992 | Gotou | |
| 5,124,777 A | 6/1992 | Lee et al. | |
| 5,179,037 A | 1/1993 | Seabaugh | |
| 5,216,271 A | 6/1993 | Takagi et al. | |

(Continued)

FOREIGN PATENT DOCUMENTS

DE   102 03 9978 A1   8/2003

(Continued)

OTHER PUBLICATIONS

International Search Report PCT/US2003/026242.

(Continued)

*Primary Examiner*—Edward Wojciechowicz
(74) *Attorney, Agent, or Firm*—Blakely, Sokoloff, Taylor & Zafman LLP

(57) ABSTRACT

Embodiments of the invention provide a device with a metal gate, a high-k gate dielectric layer, source/drain extensions a distance beneath the metal gate, and lateral undercuts in the sides of the metal gate.

4 Claims, 5 Drawing Sheets

U.S. PATENT DOCUMENTS

| | | |
|---|---|---|
| 5,218,213 A | 6/1993 | Gaul et al. |
| 5,278,012 A | 1/1994 | Yamanaka et al. |
| 5,308,999 A | 5/1994 | Gotou |
| 5,328,810 A | 7/1994 | Lowrey et al. |
| 5,338,959 A | 8/1994 | Kim et al. |
| 5,346,836 A | 9/1994 | Manning et al. |
| 5,346,839 A | 9/1994 | Sundaresan |
| 5,357,119 A | 10/1994 | Wang et al. |
| 5,391,506 A | 2/1995 | Tada et al. |
| 5,466,621 A | 11/1995 | Hisamoto et al. |
| 5,475,869 A | 12/1995 | Gomi et al. |
| 5,479,033 A | 12/1995 | Baca et al. |
| 5,482,877 A | 1/1996 | Rhee |
| 5,514,885 A | 5/1996 | Myrick |
| 5,521,859 A | 5/1996 | Ema et al. |
| 5,539,229 A | 7/1996 | Noble, Jr. et al. |
| 5,543,351 A | 8/1996 | Hirai et al. |
| 5,545,586 A | 8/1996 | Koh |
| 5,563,077 A | 10/1996 | Ha et al. |
| 5,576,227 A | 11/1996 | Hsu |
| 5,578,513 A | 11/1996 | Maegawa |
| 5,595,919 A | 1/1997 | Pan |
| 5,652,454 A | 7/1997 | Iwamatsu et al. |
| 5,658,806 A | 8/1997 | Lin et al. |
| 5,665,203 A | 9/1997 | Lee et al. |
| 5,682,048 A | 10/1997 | Shinohara et al. |
| 5,698,869 A | 12/1997 | Yoshimi et al. |
| 5,701,016 A | 12/1997 | Burroughs et al. |
| 5,716,879 A | 2/1998 | Choi et al. |
| 5,739,544 A | 4/1998 | Yuki et al. |
| 5,760,442 A | 6/1998 | Shigyo et al. |
| 5,770,513 A | 6/1998 | Okaniwa |
| 5,773,331 A | 6/1998 | Solomon et al. |
| 5,776,821 A | 7/1998 | Haskell et al. |
| 5,793,088 A | 8/1998 | Choi et al. |
| 5,804,848 A | 9/1998 | Mukai |
| 5,811,324 A | 9/1998 | Yang |
| 5,814,895 A | 9/1998 | Hirayama |
| 5,821,629 A | 10/1998 | Wen et al. |
| 5,827,769 A | 10/1998 | Aminzadeh et al. |
| 5,844,278 A | 12/1998 | Mizuno et al. |
| 5,856,225 A | 1/1999 | Lee et al. |
| 5,880,015 A | 3/1999 | Hata |
| 5,888,309 A | 3/1999 | Yu |
| 5,889,304 A | 3/1999 | Watanabe et al. |
| 5,899,710 A | 5/1999 | Mukai |
| 5,905,285 A | 5/1999 | Gardner et al. |
| 5,908,313 A | 6/1999 | Chau et al. |
| 5,952,701 A | 9/1999 | Bulucea et al. |
| 5,965,914 A | 10/1999 | Miyamoto |
| 5,976,767 A | 11/1999 | Li |
| 5,985,726 A | 11/1999 | Yu et al. |
| 6,013,926 A | 1/2000 | Oku et al. |
| 6,018,176 A | 1/2000 | Lim |
| 6,031,249 A | 2/2000 | Yamazaki et al. |
| 6,051,452 A | 4/2000 | Shigyo et al. |
| 6,054,355 A | 4/2000 | Inumiya et al. |
| 6,063,675 A | 5/2000 | Rodder |
| 6,066,869 A | 5/2000 | Noble et al. |
| 6,087,208 A | 7/2000 | Krivokapic et al. |
| 6,093,621 A | 7/2000 | Tseng |
| 6,114,201 A | 9/2000 | Wu |
| 6,114,206 A | 9/2000 | Yu |
| 6,117,741 A | 9/2000 | Chatterjee et al. |
| 6,120,846 A | 9/2000 | Hintermaier et al. |
| 6,130,123 A | 10/2000 | Liang et al. |
| 6,144,072 A | 11/2000 | Iwamatsu et al. |
| 6,150,222 A | 11/2000 | Gardner et al. |
| 6,153,485 A | 11/2000 | Pey et al. |
| 6,159,808 A | 12/2000 | Chuang |
| 6,163,053 A | 12/2000 | Kawashima |
| 6,165,880 A | 12/2000 | Yaung et al. |
| 6,174,820 B1 | 1/2001 | Habermehl et al. |
| 6,190,975 B1 | 2/2001 | Kubo et al. |
| 6,200,865 B1 | 3/2001 | Gardner et al. |
| 6,218,309 B1 | 4/2001 | Miller et al. |
| 6,251,729 B1 | 6/2001 | Montree et al. |
| 6,251,751 B1 | 6/2001 | Chu et al. |
| 6,251,763 B1 | 6/2001 | Inumiya et al. |
| 6,252,284 B1 | 6/2001 | Muller et al. |
| 6,259,135 B1 | 7/2001 | Hsu et al. |
| 6,261,921 B1 | 7/2001 | Yen et al. |
| 6,262,456 B1 | 7/2001 | Yu et al. |
| 6,274,503 B1 | 8/2001 | Hsieh |
| 6,287,924 B1 | 9/2001 | Chau et al. |
| 6,294,416 B1 | 9/2001 | Wu |
| 6,307,235 B1 | 10/2001 | Forbes et al. |
| 6,310,367 B1 | 10/2001 | Yagishita et al. |
| 6,317,444 B1 | 11/2001 | Chakrabarti et al. |
| 6,319,807 B1 | 11/2001 | Yeh et al. |
| 6,335,251 B2 | 1/2002 | Miyano et al. |
| 6,358,800 B1 | 3/2002 | Tseng |
| 6,359,311 B1 | 3/2002 | Colinge et al. |
| 6,362,111 B1 | 3/2002 | Laaksonen et al. |
| 6,368,923 B1 | 4/2002 | Huang |
| 6,376,317 B1 | 4/2002 | Forbes et al. |
| 6,383,882 B1 | 5/2002 | Lee et al. |
| 6,387,820 B1 | 5/2002 | Sanderfer |
| 6,391,782 B1 | 5/2002 | Yu |
| 6,396,108 B1 | 5/2002 | Krivokapic et al. |
| 6,399,970 B2 | 6/2002 | Kubo et al. |
| 6,403,434 B1 | 6/2002 | Yu |
| 6,403,981 B1 | 6/2002 | Yu |
| 6,407,442 B2 | 6/2002 | Inoue et al. |
| 6,410,371 B1 | 6/2002 | Yu et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,457,890 B1 | 10/2002 | Kohlruss et al. |
| 6,458,662 B1 | 10/2002 | Yu |
| 6,459,123 B1 | 10/2002 | Enders et al. |
| 6,462,611 B2 | 10/2002 | Hisamoto et al. |
| 6,465,290 B1 | 10/2002 | Suguro et al. |
| 6,472,258 B1 | 10/2002 | Adkisson et al. |
| 6,475,869 B1 | 11/2002 | Yu |
| 6,475,890 B1 | 11/2002 | Yu |
| 6,479,866 B1 | 11/2002 | Xiang |
| 6,483,146 B2 | 11/2002 | Lee |
| 6,483,151 B2 | 11/2002 | Wakabayashi et al. |
| 6,483,156 B1 | 11/2002 | Adkisson et al. |
| 6,495,403 B1 | 12/2002 | Skotnicki et al. |
| 6,498,096 B2 | 12/2002 | Bruce et al. |
| 6,500,767 B2 | 12/2002 | Chiou et al. |
| 6,501,141 B1 | 12/2002 | Leu |
| 6,506,692 B2 | 1/2003 | Andideh |
| 6,515,339 B2 | 2/2003 | Shin et al. |
| 6,525,403 B2 | 2/2003 | Inaba et al. |
| 6,526,996 B1 | 3/2003 | Chang et al. |
| 6,534,807 B2 | 3/2003 | Mandelman et al. |
| 6,537,862 B2 | 3/2003 | Song |
| 6,537,885 B1 | 3/2003 | Kang et al. |
| 6,537,901 B2 | 3/2003 | Cha et al. |
| 6,541,829 B2 | 4/2003 | Nishinohara et al. |
| 6,555,879 B1 | 4/2003 | Krivokapic et al. |
| 6,562,665 B1 | 5/2003 | Yu |
| 6,562,687 B1 | 5/2003 | Deleonibus |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |

| Patent | Type | Date | Inventor |
|---|---|---|---|
| 6,642,090 | B1 | 11/2003 | Fried et al. |
| 6,642,114 | B2 | 11/2003 | Nakamura |
| 6,645,797 | B1 | 11/2003 | Buynoski et al. |
| 6,645,826 | B2 | 11/2003 | Yamazaki et al. |
| 6,645,861 | B2 | 11/2003 | Cabral et al. |
| 6,656,853 | B2 | 12/2003 | Ito |
| 6,657,259 | B2 | 12/2003 | Fried et al. |
| 6,660,598 | B2 | 12/2003 | Hanafi et al. |
| 6,664,160 | B2 | 12/2003 | Park et al. |
| 6,680,240 | B1 | 1/2004 | Maszara |
| 6,686,231 | B1 | 2/2004 | Ahmed et al. |
| 6,689,650 | B2 | 2/2004 | Gambino et al. |
| 6,693,324 | B2 | 2/2004 | Maegawa et al. |
| 6,696,366 | B1 | 2/2004 | Morey et al. |
| 6,706,571 | B1 | 3/2004 | Yu et al. |
| 6,709,982 | B1 | 3/2004 | Buynoski et al. |
| 6,713,396 | B2 | 3/2004 | Anthony |
| 6,716,684 | B1 | 4/2004 | Krivokapic et al. |
| 6,716,686 | B1 | 4/2004 | Buynoski et al. |
| 6,716,690 | B1 | 4/2004 | Wang et al. |
| 6,730,964 | B2 | 5/2004 | Horiuchi |
| 6,744,103 | B2 | 6/2004 | Snyder |
| 6,756,657 | B1 | 6/2004 | Zhang et al. |
| 6,762,469 | B2 | 7/2004 | Mocuta et al. |
| 6,764,884 | B1 | 7/2004 | Yu et al. |
| 6,770,516 | B2 | 8/2004 | Wu et al. |
| 6,774,390 | B2 | 8/2004 | Sugiyama et al. |
| 6,784,071 | B2 | 8/2004 | Chen et al. |
| 6,784,076 | B2 | 8/2004 | Gonzalez et al. |
| 6,787,402 | B1 | 9/2004 | Yu |
| 6,787,406 | B1 | 9/2004 | Hill et al. |
| 6,787,439 | B2 | 9/2004 | Ahmed et al. |
| 6,787,845 | B2 | 9/2004 | Deleonibus |
| 6,787,854 | B1 | 9/2004 | Yang et al. |
| 6,790,733 | B1 | 9/2004 | Natzle et al. |
| 6,794,313 | B1 | 9/2004 | Chang |
| 6,794,718 | B2 | 9/2004 | Nowak et al. |
| 6,798,000 | B2 | 9/2004 | Luyken et al. |
| 6,800,885 | B1 | 10/2004 | An et al. |
| 6,800,910 | B2 | 10/2004 | Lin et al. |
| 6,803,631 | B2 | 10/2004 | Dakshina-Murthy et al. |
| 6,812,075 | B2 | 11/2004 | Fried et al. |
| 6,812,111 | B2 | 11/2004 | Cheong et al. |
| 6,815,277 | B2 | 11/2004 | Fried et al. |
| 6,821,834 | B2 | 11/2004 | Ando |
| 6,825,506 | B2 | 11/2004 | Chau et al. |
| 6,830,998 | B1 | 12/2004 | Pan et al. |
| 6,831,310 | B1 | 12/2004 | Matthew et al. |
| 6,833,588 | B2 | 12/2004 | Yu et al. |
| 6,835,614 | B2 | 12/2004 | Hanafi et al. |
| 6,835,618 | B1 | 12/2004 | Dakshina-Murthy et al. |
| 6,838,322 | B2 | 1/2005 | Pham et al. |
| 6,844,238 | B2 | 1/2005 | Yeo et al. |
| 6,849,556 | B2 | 2/2005 | Takahashi |
| 6,849,884 | B2 | 2/2005 | Clark et al. |
| 6,852,559 | B2 | 2/2005 | Kwak et al. |
| 6,855,588 | B1 | 2/2005 | Liao et al. |
| 6,855,606 | B2 | 2/2005 | Chen et al. |
| 6,855,990 | B2 | 2/2005 | Yeo et al. |
| 6,858,472 | B2 | 2/2005 | Schoenfeld |
| 6,858,478 | B2 | 2/2005 | Chau et al. |
| 6,864,519 | B2 | 3/2005 | Yeo et al. |
| 6,864,540 | B1 | 3/2005 | Divakaruni et al. |
| 6,867,433 | B2 | 3/2005 | Yeo et al. |
| 6,867,460 | B1 | 3/2005 | Anderson et al. |
| 6,869,868 | B2 | 3/2005 | Chiu et al. |
| 6,869,898 | B2 | 3/2005 | Inaki et al. |
| 6,870,226 | B2 | 3/2005 | Maede et al. |
| 6,881,635 | B1 | 4/2005 | Chidambarrao et al. |
| 6,884,154 | B2 | 4/2005 | Mizushima et al. |
| 6,885,055 | B2 | 4/2005 | Lee |
| 6,888,199 | B2 | 5/2005 | Nowak et al. |
| 6,890,811 | B2 | 5/2005 | Hou et al. |
| 6,891,234 | B1 | 5/2005 | Connelly et al. |
| 6,897,527 | B2 | 5/2005 | Dakshina-Murthy et al. |
| 6,902,947 | B2 | 6/2005 | Chinn et al. |
| 6,902,962 | B2 | 6/2005 | Yeo et al. |
| 6,909,147 | B2 | 6/2005 | Aller et al. |
| 6,909,151 | B2 | 6/2005 | Hareland et al. |
| 6,919,238 | B2 | 7/2005 | Bohr |
| 6,921,691 | B1 | 7/2005 | Li et al. |
| 6,921,702 | B2 | 7/2005 | Ahn et al. |
| 6,921,963 | B2 | 7/2005 | Krivokapic et al. |
| 6,921,982 | B2 | 7/2005 | Joshi et al. |
| 6,924,190 | B2 | 8/2005 | Dennison |
| 6,946,377 | B2 | 9/2005 | Chambers |
| 6,955,969 | B2 | 10/2005 | Djomehri et al. |
| 6,960,517 | B2 | 11/2005 | Rios et al. |
| 6,967,351 | B2 | 11/2005 | Fried et al. |
| 6,969,878 | B2 | 11/2005 | Coronel et al. |
| 6,974,738 | B2 | 12/2005 | Hareland |
| 6,975,014 | B1 | 12/2005 | Krivokapic et al. |
| 6,977,415 | B2 | 12/2005 | Matsuo |
| 6,998,301 | B1 | 2/2006 | Yu et al. |
| 6,998,318 | B2 | 2/2006 | Park |
| 7,018,551 | B2 | 3/2006 | Beintner et al. |
| 7,045,401 | B2 | 5/2006 | Lee et al. |
| 7,045,407 | B2 | 5/2006 | Keating et al. |
| 7,045,441 | B2 | 5/2006 | Chang et al. |
| 7,045,451 | B2 | 5/2006 | Shenai-Khatkhate et al. |
| 7,056,794 | B2 | 6/2006 | Ku et al. |
| 7,060,539 | B2 | 6/2006 | Chidambarrao et al. |
| 7,061,055 | B2 | 6/2006 | Sekigawa et al. |
| 7,071,064 | B2 | 7/2006 | Doyle et al. |
| 7,074,623 | B2 | 7/2006 | Lochtefeld et al. |
| 7,074,656 | B2 | 7/2006 | Yeo |
| 7,074,662 | B2 | 7/2006 | Lee et al. |
| 7,084,018 | B1 | 8/2006 | Ahmed et al. |
| 7,105,390 | B2 | 9/2006 | Brask et al. |
| 7,105,891 | B2 | 9/2006 | Visokay et al. |
| 7,105,894 | B2 | 9/2006 | Yeo et al. |
| 7,105,934 | B2 | 9/2006 | Anderson et al. |
| 7,112,478 | B2 | 9/2006 | Grupp et al. |
| 7,115,954 | B2 | 10/2006 | Shimizu et al. |
| 7,119,402 | B2 | 10/2006 | Kinoshita et al. |
| 7,122,463 | B2 | 10/2006 | Ohuchi |
| 7,132,360 | B2 | 11/2006 | Schaefer et al. |
| 7,138,320 | B2 | 11/2006 | Bentum et al. |
| 7,141,480 | B2 | 11/2006 | Adam et al. |
| 7,141,856 | B2 | 11/2006 | Lee et al. |
| 7,154,118 | B2 | 12/2006 | Lindert |
| 7,163,851 | B2 | 1/2007 | Abadeer et al. |
| 7,172,943 | B2 | 2/2007 | Yeo et al. |
| 7,183,137 | B2 | 2/2007 | Lee et al. |
| 7,187,043 | B2 | 3/2007 | Arai et al. |
| 7,196,372 | B1 | 3/2007 | Yu et al. |
| 7,238,564 | B2 | 7/2007 | Ko et al. |
| 7,241,653 | B2 | 7/2007 | Hareland et al. |
| 7,247,547 | B2 | 7/2007 | Zhu et al. |
| 7,247,578 | B2 | 7/2007 | Brask |
| 7,250,645 | B1 | 7/2007 | Wang et al. |
| 7,250,655 | B2 * | 7/2007 | Bae et al. .................... 257/336 |
| 7,256,455 | B2 | 8/2007 | Ahmed et al. |
| 7,268,024 | B2 | 9/2007 | Yeo et al. |
| 7,268,058 | B2 | 9/2007 | Chau et al. |
| 7,291,886 | B2 | 11/2007 | Doris et al. |
| 7,297,600 | B2 | 11/2007 | Oh et al. |
| 7,304,336 | B2 | 12/2007 | Cheng et al. |
| 7,323,710 | B2 | 1/2008 | Kim et al. |
| 7,326,634 | B2 | 2/2008 | Lindert et al. |
| 7,329,913 | B2 | 2/2008 | Brask et al. |
| 7,348,284 | B2 | 3/2008 | Doyle et al. |
| 7,354,817 | B2 | 4/2008 | Wantanabe et al. |
| 7,358,121 | B2 | 4/2008 | Chau et al. |
| 7,385,262 | B2 | 6/2008 | O'Keeffe et al. |
| 7,396,730 | B2 | 7/2008 | Li |

| Publication No. | Date | Inventor |
|---|---|---|
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino |
| 2003/0067017 A1 | 4/2003 | Ieong et al. |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0186167 A1 | 10/2003 | Johnson, Jr. et al. |
| 2003/0190766 A1 | 10/2003 | Gonzalez et al. |
| 2003/0201458 A1 | 10/2003 | Clark et al. |
| 2003/0227036 A1 | 12/2003 | Sugiyama et al. |
| 2004/0016968 A1 | 1/2004 | Coronel et al. |
| 2004/0029323 A1 | 2/2004 | Shimizu et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1* | 7/2004 | Doris et al. ............... 438/182 |
| 2004/0132567 A1 | 7/2004 | Schonnenbeck |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0173815 A1 | 9/2004 | Yeo et al. |
| 2004/0173846 A1 | 9/2004 | Hergenrother et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0197975 A1 | 10/2004 | Krivokapic et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0253792 A1 | 12/2004 | Cohen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0017377 A1 | 1/2005 | Joshi et al. |
| 2005/0019993 A1 | 1/2005 | Lee et al. |
| 2005/0020020 A1 | 1/2005 | Collaert et al. |
| 2005/0035391 A1 | 2/2005 | Lee et al. |
| 2005/0035415 A1 | 2/2005 | Yeo et al. |
| 2005/0040444 A1 | 2/2005 | Cohen |
| 2005/0059214 A1 | 3/2005 | Cheng et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0104096 A1 | 5/2005 | Lee et al. |
| 2005/0110082 A1 | 5/2005 | Cheng |
| 2005/0118790 A1 | 6/2005 | Lee et al. |
| 2005/0127362 A1 | 6/2005 | Zhang et al. |
| 2005/0127632 A1 | 6/2005 | Gehre |
| 2005/0133866 A1 | 6/2005 | Chau et al. |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0167766 A1 | 8/2005 | Yagishita |
| 2005/0170593 A1 | 8/2005 | Kang et al. |
| 2005/0184316 A1 | 8/2005 | Kim et al. |
| 2005/0189583 A1 | 9/2005 | Kim et al. |
| 2005/0191795 A1 | 9/2005 | Chidambarrao et al. |
| 2005/0199919 A1 | 9/2005 | Liu |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224798 A1 | 10/2005 | Buss |
| 2005/0224800 A1 | 10/2005 | Lindert et al. |
| 2005/0227498 A1 | 10/2005 | Furukawa et al. |
| 2005/0230763 A1 | 10/2005 | Huang et al. |
| 2005/0233156 A1 | 10/2005 | Senzaki et al. |
| 2005/0239252 A1 | 10/2005 | Ahn et al. |
| 2005/0255642 A1 | 11/2005 | Liu |
| 2005/0266645 A1 | 12/2005 | Park |
| 2005/0272192 A1 | 12/2005 | Oh et al. |
| 2005/0277294 A1 | 12/2005 | Schaeffer et al. |
| 2005/0280121 A1 | 12/2005 | Doris et al. |
| 2006/0014338 A1 | 1/2006 | Doris et al. |
| 2006/0040054 A1 | 2/2006 | Pearlstein et al. |
| 2006/0046521 A1 | 3/2006 | Vaartstra et al. |
| 2006/0063469 A1 | 3/2006 | Talieh et al. |
| 2006/0068590 A1 | 3/2006 | Lindert et al. |

| | | | |
|---|---|---|---|
| 2006/0068591 A1 | 3/2006 | Radosavljevic et al. | |
| 2006/0071299 A1 | 4/2006 | Doyle et al. | |
| 2006/0086977 A1 | 4/2006 | Shah et al. | |
| 2006/0138548 A1 | 6/2006 | Richards et al. | |
| 2006/0154478 A1 | 7/2006 | Hsu et al. | |
| 2006/0172480 A1 | 8/2006 | Wang et al. | |
| 2006/0202270 A1 | 9/2006 | Son et al. | |
| 2006/0205164 A1 | 9/2006 | Ko et al. | |
| 2006/0211184 A1 | 9/2006 | Boyd et al. | |
| 2006/0227595 A1 | 10/2006 | Chuang et al. | |
| 2006/0240622 A1 | 10/2006 | Lee et al. | |
| 2006/0263699 A1 | 11/2006 | Abatchev et al. | |
| 2006/0281325 A1 | 12/2006 | Chou et al. | |
| 2007/0001219 A1 | 1/2007 | Radosavljevic et al. | |
| 2007/0023795 A1 | 2/2007 | Nagano et al. | |
| 2007/0045748 A1 | 3/2007 | Booth et al. | |
| 2007/0048930 A1 | 3/2007 | Figura et al. | |
| 2007/0093010 A1 | 4/2007 | Mathew et al. | |
| 2007/0108514 A1 | 5/2007 | Inoue et al. | |
| 2007/0241414 A1 | 10/2007 | Narihiro | |
| 2007/0262389 A1 | 11/2007 | Chau et al. | |

FOREIGN PATENT DOCUMENTS

| | | |
|---|---|---|
| EP | 0 623963 A1 | 11/1994 |
| EP | 1 091 413 A2 | 4/2001 |
| EP | 1 202 335 A2 | 5/2002 |
| EP | 1 566 844 A2 | 8/2005 |
| GB | 2 156 149 | 10/1985 |
| JP | 56073454 A | 6/1981 |
| JP | 59 145538 A | 8/1984 |
| JP | 02-303048 A | 12/1990 |
| JP | 0600 5856 | 1/1994 |
| JP | 06-151387 A | 5/1994 |
| JP | 06177089 | 6/1994 |
| JP | 06224440 A | 8/1994 |
| JP | 7-50421 A | 2/1995 |
| JP | 09-162301 A | 6/1997 |
| JP | 2000 037842 A | 2/2000 |
| JP | 2001 338987 | 12/2001 |
| JP | 2002-110977 A | 12/2002 |
| JP | 2003-298051 | 10/2003 |
| KR | 10 0222363 | 10/1999 |
| TW | 2004 14538 | 8/1992 |
| TW | 2005 18310 | 11/1998 |
| TW | 516232 | 1/2003 |
| TW | 561530 | 1/2003 |
| TW | 546713 | 8/2003 |
| TW | 548799 | 8/2003 |
| TW | 2004 02872 | 2/2004 |
| TW | 2004 05408 | 4/2004 |
| TW | 591798 | 6/2004 |
| TW | 594990 | 6/2004 |
| TW | 2004 14539 | 8/2004 |
| TW | 2004 17034 | 9/2004 |
| TW | 1223449 | 11/2004 |
| TW | 1231994 | 5/2005 |
| TW | 1238524 | 8/2005 |
| TW | 1239102 | 9/2005 |
| WO | WO 02/43151 A1 | 5/2002 |
| WO | WO 02/095814 | 11/2002 |
| WO | WO 03/003442 | 1/2003 |
| WO | WO 2006/007350 A1 | 1/2003 |
| WO | WO 2004/059726 A1 | 7/2004 |
| WO | WO 2005/034212 A2 | 4/2005 |
| WO | WO 2005/036651 A1 | 4/2005 |
| WO | WO 2005/098963 A1 | 10/2005 |
| WO | WO 2006/078469 A1 | 7/2006 |
| WO | WO 2007/002426 A2 | 1/2007 |
| WO | WO 2007/041152 A1 | 4/2007 |

OTHER PUBLICATIONS

International Search Report PCT/US2003/039727.
International Search Report PCT/US2003/040320.
International Search Report PCT/US2005/000947.
International Search Report PCT/US2005/010505.
International Search Report PCT/US2005/020339.
International Search Report PCT/US2005/033439.
International Search Report PCT/US2005/035380.
International Search Report PCT/US2004/032442.
International Search Report PCT/US2006/024516.
International Search Report and Written Opinion PCT/US2006/000378.
International Search Report PCT/US2006/037643.
International Search Report PCT/US2005/037169.
Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.
Yang-Kyu Choi, et al., "A Spacer Patterning Technology for Nanoscale CMOS" IEEE Transactions on Electron Devices, vol. 49, No. 3, Mar. 2002, pp. 436-441.
W. Xiong, et al., "Corner Effect in Multiple-Gate SOI MOSFETs" 2003 IEEE, pp. 111-113.
Weize Xiong, et al., "Improvement of FinFET Electrical Characteristics by Hydrogen Annealing" IEEE Electron Device Letters, vol. 25, No. 8, Aug. 2004, XP-001198998, pp. 541-543.
Fu-Liang Yang, et al., "5nm-Gate Nanowire FinFET" 2004 Symposium on VLSI Technology Digest of Technical Papers, 2004 IEEE, pp. 196-197.
Jing Guo et al. "Performance Projections for Ballistic Carbon Nanotube Field-Effect Transistors" Applied Physics Letters, vol. 80, No. 17, Apr. 29, 2002, pp. 3192-2194.
Ali Javey et al., "High-K Dielectrics for Advanced Carbon-Nanotube Transistors and Logic Gates", Advance Online Publication, Published online, Nov. 17, 2002, pp. 1-6.
Richard Martel et al., "Carbon Nanotube Field Effect Transistors for Logic Applications" IBM, T.J. Watson Research Center, 2001 IEEE, IDEM 01, pp. 159-162.
David M. Fried et al., "Improved Independent Gate N-Type FinFET Fabrication and Characterization", IEEE Electron Device Letters, vol. 24, No. 9, Sep. 2003, pp. 592-594.
David M. Fried et al., "Improved Independent Gate P-Type Independent-Gate FinFETs", IEEE Electron Device Letters, vol. 25, No. 4, Apr. 2004, pp. 199-201.
Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.
Charles Kuo et al., "A Capacitorless Double-Gate DRAM Cell Design for High Density Applications", 2002 IEEE International Electron Devices Meeting Technical Digest, Dec. 2002, pp. 843-846.
Takashi Ohsawa et al., "Memory Design Using a One-Transistor Gain Cell on SOI", IEEE Journal of Solid-State Circuits, vol. 37, No. 11, Nov. 2002, pp. 1510-1522.
T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs.).
V. Subramanian et al. "A Bulk Si-Compatible Ultrathin-Body SOI Technology for Sub-100nm MOSFETS", Proceedings of the 57th Annual Device Reach Conference, (1999) pp. 28-29.
Hisamoto et al. "A Folded-Channel MOSFET for Deep-sub-tenth Micron Era", 1998 IEEE International Electron Device Meeting Technical Digest, (1998) pp. 1032-1034.
Huang et al., "Sub 50nm FinFet: PMOS", 1999 IEEE International Electron Device Meeting Technical Digets, (1999) pp. 67-70.
Auth et al., "Vertical, Fully-Depleted, Surroundings Gate MOSFETS on Sub 0.1um Thick Silicon Pillars", 1996 54th Annual Device Research Conference Digest, (1996) pp. 108-109.

Hisamoto et al., "A Fully Depleted Lean-Channel Transistor (DELTA)-A Novel Vertical Ultrathin SOI MOSFET", IEEE Electron Device Letters, vol. 11 No. 1, (1990) pp. 36-38.
Jong-Tae Park et al., "Pi-Gate SOI MOSFET" IEEE Electron Device Letters, vol. 22, No. 8, Aug. 2001, pp. 405-406.
Digh Hisamoto et al., "FinFet-A Self Aligned Double-Gate MOSFET Scalable to 20nm", IEEE Transactions on Electron Devices, vol. 47, No. 12, Dec. 2000, pp. 2320-2325.
T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.
A. Burenkov et al., "Corner Effect in Double and Triple Gate FinFets", IEEE 2003, pp. 135-138.
S.T. Chang et al., "3-D Simulation of Strained Si/SiGe Heterojunction FinFETs", pp. 176-177.
B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.
R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).
T. Ludwig et al., "FinFET Technology for Future Microprocessors" 2003 IEEE, pp. 33-34.
Peter A. Stolk et al. "Modeling Statistical Dopant Fluctuations in MOS Transistors", 1998 IEEE, IEEE Transactions on Electron Devices, vol. 45, No. 9, Sep. 1998, pp. 1960-1971.
Evert Seevinck et al., "Static-Noise Margin Analysis of MOS SRAM Cells" 1987 IEEE, IEEE Journals of Solid-State Circuits, vol. SC-22, No. 5, Oct. 1987.
Yang-Kyu Choi et al. "Sub-20nm CMOS FinFET Technologies", IEEE 2001, IEDM 01-421 to 01-424.
M. Ieong et al. "Three Dimensional CMOS Devices and Integrated Circuits", IEEE 2003, CICC, San Jose, CA, Sep. 21-24, 2003, pp. 207-214.
E.J. Nowak et al., "Scaling Beyond the 65nm Node with FinFET-DGCMOS", IEEE 2003, CICC, San Jose, CA, Sep. 21-24, 2003, pp. 339-342.
E.C. Jones, "Doping Challenges in Exploratory Devices for High Performance Logic", 14th International Conference, Piscataway, NJ, Sep. 22-27, 2002, pp. 1-6.
T. Park et al. "PMOS Body-Tied FinFET (Omega MOSFET) Characteristics", Device Research Conference, Piscataway, NJ, Jun. 23-25, 2003, IEEE, pp. 33-34.
E.J. Nowak et al., "A Functional FinFET-DGCMOS SRAM Cell", International Electron Devices Meeting 2002, San Francisco, CA, Dec. 8-11, 2002, pp. 411-414.
Jae-Hyoun Park, "Quantum-wired MOSFET Photodetector Fabricated by Conventional Photolithography on SOI Substrate", Nanotechnology, 2004, 4th IEEE Conference on Munich, Germany, Aug. 16-19, 2004, Piscataway, NJ, pp. 425-427, XP010767302.
L. Chang et al. "CMOS Circuit Performance Enhancement by Surface Orientation Optimization" IEEE Transactions on Electron Devices, IEEE Service Center, Piscataway, NJ vol. 51, No. 10, Oct. 2004, pp. 1621-1627 XP001211140.
M. Stadele et al., "A Comprehensive Study of Corner Effects in Tri-gate Transistors", IEEE 2004, pp. 165-168.
Ali Javey et al., "Ballistic Carbon Nanotube Field-Effect Transistors", Nature, vol. 424, Aug. 7, 2003, pp. 654-657.
T. M. Mayer, et al., "Chemical Vapor Deposition of Fluoroalkylsilane Monolayer Films for Adhesion Control in Microelectromechanical Systems" 2000 American Vacuum Society B 18(5), Sep.-Oct. 2000, pp. 2433-2440.

R. Chau et al., Advanced Depleted-Substrate Transistors: Single-Gate, Double-Gate and Tri-gate (Invited Paper), Components Research, Logic Technology Development, Intel Corporation, Hillsboro OR, 2 pages.
Buchanan, D. A., et al., "Fabrication of Midgap Metal Gates Compatible with Ultrathin Dielectrics," Applied Physics Letters, 73.12, (Sep. 21, 1998), pp. 1676-1678.
Claflin, B., et al., "Interface Studies of Tungsten Nitride and Titanium Nitride Composite Metal Gate Electrodes with Thin Dielectric Layers," Journal of Vacuum Science and Technology A 16.3, (May/Jun. 1998), pp. 1757-1761.
Collaert, N. et al. "A Functional 41-Stage ring oscillator using scaled FinFET devices with 25-nm gate lengths and 10-nm fin widths applicable for the 45-nm CMOS node" IEEE Electron Device Letters, vol. 254, No. 8 (Aug. 2004), pp. 568-570.
Fried, David M. et al., "High-Performance P-Type Independent-Gate FinFETs" IEEE Electron Device Letters, vol. 25, No. 4, Apr. 2004, pp. 199-201.
Fried, David et al., "Improved Independent Gate N-Type FinFET Fabrication and Characterization", IEEE Electron Device Letters, vol. 24, No. 9, Sep. 2003, pp. 592-594.
Hwang, Jeong-Mo et al., "Novel Polysilicon/Tin Stacked-Gate Structure for Fully-Depleted SOI/CMOS," International Electronic Devices Meeting Technical Digest, (1992), pp. 345-348.
Lide, David R. "Properties of Semiconductors" CRC Handbook of Chemistry and Physics, Internet version 2007, (87th edition), David R. Lide—Editor; Taylor & Francis, pp. 12-77-12-89.
Nackaerts et al., "A 0.314μm$^2$ 6T-SRAM Cell build with Tall Triple-Gate Devices for 45nm node applications using 0.75NA 193nm lithography," IDEM, (2004), pp. 269-272.
Nowak, Edward J. et al., "Turning Silicon On Its Edge," IEEE Circuits & Devices Magazine, vol. 1, (Jan./Feb. 2004), pp. 20-31.
Park, Donggun et al., "3-Dimensional nano-CMOS Transistors to Overcome Scaling Limits," IEEE 2004, ISBN 0-7803-8511-X, (2004), pp. 35-40.
Park, Jong-Tae, et al., "Pi-Gate SOI MOSFET". IEEE Electron Device Letters, vol. 22, No. 8, Aug. 2001, pp. 405-406.
Sugizaki, T. et al., "Novel Multi-bit SONOS Type Flash Memory Using a High-k Charge Trapping Layer," VLSI Technology, 2003, Digest of Technical Papers, Symposium on, Jun. 10-12, 2003, (2003), pp. 27-28.
Tang, Stephen H. et al., "FinFET —A quasi-planar double-gate MOSFET", 2001 IEEE International Solid-State Circuits Conference (Feb. 6, 2001), pp. 1-3, (2001).
Tokoro, Kenji et al., "Anisotropic Etching Properties of Silicon in KOH and TMAH Solutions," International Symposium on Micromechatronics and Human Science, IEEE (1998), pp. 65-70.
Wolf, Stanley et al., "Wet Etching Silicon," Silicon Processing for the VLSI Era, vol. 1: Process Technology, Lattice Press, Sunset Beach, CA, (Sep. 1986), 3 pages.
Yang, Fu-Liang et al., "25 nm CMOS Omega FETs" IEEE 2002, 10.3.1-10-.3.4, pp. 255-258, (2002).
PCT "International Preliminary Report on Patentability", for PCT/US/2006/037634, mailed Apr. 10, 2008, 12 pp.
PCT "International Preliminary Report on Patentability and Written Opinion" for PCT/US2005/037169 mailed May 10, 2007, 7 pp.
Taiwan "IPO Search Report" for Application No. 094136197, mailed Sep. 19, 2008, 4 pp. (no translation available).
Austrian Patent Office "Written Opinion" for Singapore Patent Application No. 200604766-6, mailed Apr. 4, 2008, 4 pp.

* cited by examiner

LATERAL UNDERCUT OF METAL GATE IN SOI DEVICE

This is a Divisional application of Ser. No. 11/207,051 filed Aug. 17, 2005 now U.S. Pat. No. 7,402,875, which is presently pending.

BACKGROUND

Background of the Invention

MOS field-effect transistors on semiconductor on insulator (SOI) substrates may experience unacceptable leakage currents. This may result from source-side amplification of the band-to-band tunneling leakage due to a high vertical E-field in the drain extension region. Conventionally, the gate dielectric may be made thicker to combat this leakage. Thicker gate dielectric results in lower performance and prevents downward scaling of the transistor.

In PMOS SOI metal gate transistors, for example, a thickness of a metal gate on a high-k (high dielectric constant) gate dielectric may be selected to result in a desired threshold voltage ($V_{Th}$). A thicker metal layer may have a higher work function and lower $V_{Th}$. However, a thicker metal gate also results in a higher E-field and more leakage current. Conventionally, the thicker dielectric layer used to prevent leakage current reduces performance of the device, as well as the ability to scale the device to smaller sizes.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
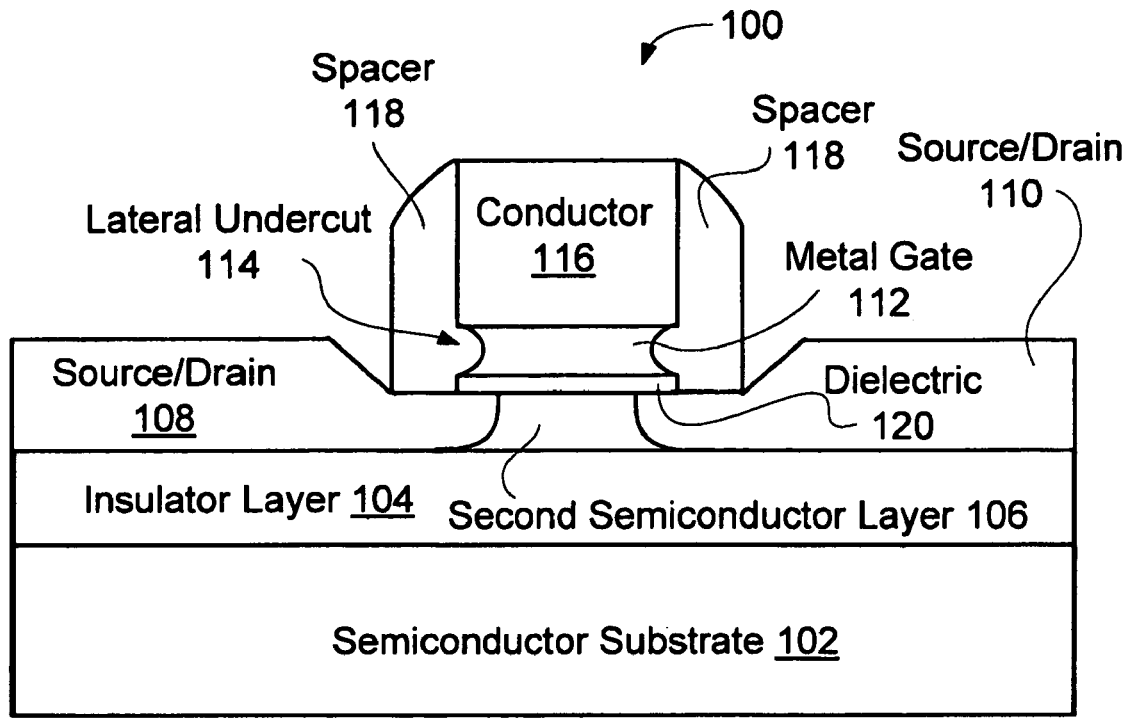
FIG. 1 is a cross sectional side view that illustrates the semiconductor device of one embodiment of the present invention.

FIG. 1 is a cross sectional side view that illustrates the semiconductor device 100 of one embodiment of the present invention. In an embodiment, the device 100 may be a tri-gate transistor on a substrate with a buried insulating layer. Such a tri-gate transistor may have a metal gate and a high-k gate dielectric. In other embodiments, the device 100 may be a different type of transistor, such as a planar transistor, a FIN-FET transistor, or a different type of transistor or other device 100.

The device 100 as illustrated in FIG. 1 may include a semiconductor substrate 102. This semiconductor substrate 102 may be a silicon substrate, such as single crystal silicon, a different type of semiconductor material, or combination of materials. On the semiconductor substrate 102 may be an insulator layer 104. The insulator layer 104 may be a layer of oxide, such as silicon oxide, or another type of insulating material. There may be a second semiconductor layer 106 on the insulator layer 104. The second semiconductor layer 106 may comprise silicon, a different type of semiconductor material, or a combination of materials. In an embodiment, the second semiconductor layer 106 may be a layer of single crystal silicon. In combination, the semiconductor substrate 102, insulator layer 104, and second semiconductor layer 106 may be a semiconductor on insulator substrate (SOI), where each device 100 may be isolated electrically from other devices on the substrate by the insulator layer 104. In an embodiment, the semiconductor on insulator substrate may be a silicon on insulator substrate. As there are two semiconductor layers (substrate 102 and second layer 106), the substrate 102 may be referred to as a first semiconductor layer or a first semiconductor substrate.

The second semiconductor layer 106 may include source/drain regions 108, 110 in some embodiments. These source/drain regions 108, 110 may be formed by doping the second semiconductor layer 106 in some embodiments. In other embodiments, the source/drain regions 108, 110 may be formed by removing portions of the second semiconductor layer 106 and replacing the removed portions with other materials. The source/drain regions 108, 110 may include extensions so that the source/drain regions 108, 110 reach beneath structures such as dielectric layer 120 and/or metal gate 112 that are above the second semiconductor layer 106.

There may be a dielectric layer 120 on the second semiconductor layer 106 in some embodiments. The dielectric layer 120 may have a length (the distance from left to right in FIG. 1). The dielectric layer 120 may be a high-k dielectric layer 120 in some embodiments. A high-k gate dielectric layer 120 may have a k-value higher than about 7.5 in some embodiments. In other embodiments, a high-k dielectric layer 120 may have a k-value higher than about 10. In other embodiments, a high-k dielectric layer 120 may comprise a material such as $Al_2O_3$ with a k-value of about 12, or may comprise a material with a higher k-value than that. In other embodiments, a high-k dielectric layer 120 may have a k-value between about 15 and about 25, e.g., $HfO_2$. In yet other embodiments, a high-k dielectric layer 120 may have a k-value even higher, such as 35, 80 or even higher.

There may be a metal gate 112 on the dielectric layer 120 in some embodiments. The metal gate 112 may have a thickness (distance from top of metal gate 112 to bottom of metal gate 112 in FIG. 1) selected for a desired work function and threshold voltage ($V_{Th}$) of the gate. The metal gate 112 may have lateral undercuts 114 in its side walls. As shown in FIG. 1, the metal gate 112 has a lateral undercut 114 on a first side of the metal gate 112 (the left side) and a lateral undercut 114 on a second side of the metal gate 112 (the right side). The lateral undercuts 114 may reduce the length (the distance from left to right in FIG. 1) of the metal gate 112 so that it is less than the length of the dielectric layer 120.

There may be a conductor 116 on the metal gate 112 in some embodiments. The conductor 116 may comprise polysilicon or another material and/or combination of materials. The conductor 116 may have a length (the distance from left to right in FIG. 1) that, because of the lateral undercuts 114 of the metal gate 112, is greater than the length of the metal gate 112. The length of the conductor 116 may be about the same as the length of the dielectric layer 120 in some embodiments, although in other embodiments it may be different. There may also be silicide regions (not shown) on the conductor 116 and source/drain regions 108, 110 to which contacts may be formed in some embodiments.

There may be a set of spacers 118 formed on either side of the dielectric layer 120, metal gate 112, and conductor 116. The spacers 118 may be formed of an insulating material in some embodiments, such as a nitride or oxide. The spacers 118 may fill in the lateral undercuts 114 of the metal gate 112.

The lateral undercuts 114 may reduce the vertical E-field in the portions of the metal gate 112 over the source/drain extensions beneath the metal gate 112, which may reduce leakage current when the device 100 is in an off state. This may allow the device 100 to have a thin dielectric layer 120 while still having a thick metal gate 112 and an acceptable level of leakage current. Thus, the thickness of the metal gate 112, and the threshold voltage of the device 100 may be chosen without requiring a thick dielectric layer 120, allowing the device 100 to have increased performance.

Figure 2:
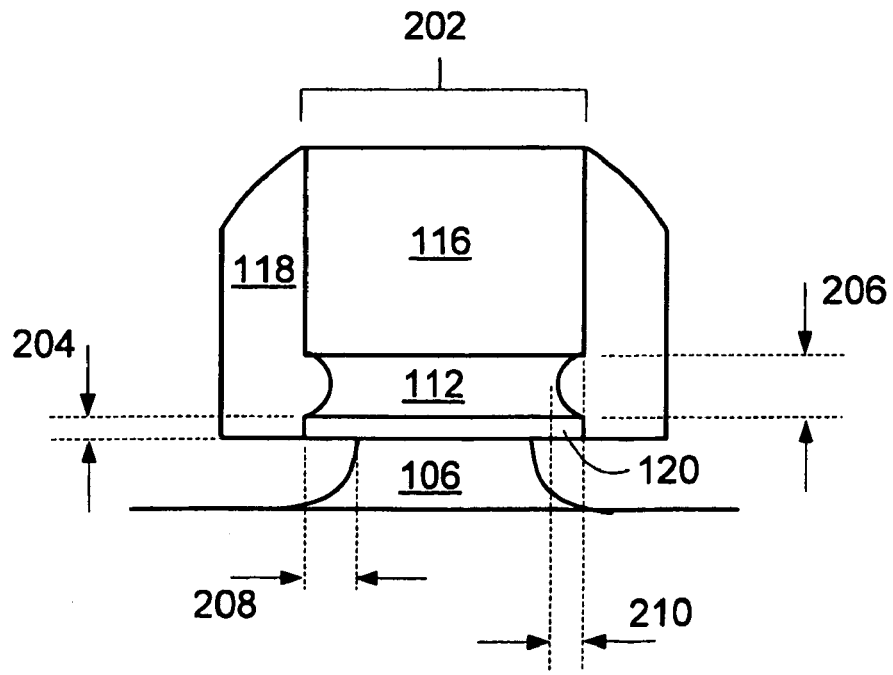
FIG. 2 is a cross sectional side view that illustrates a portion of the semiconductor device of one embodiment of the present invention in more detail.

FIG. 2 is a cross sectional side view that illustrates a portion of the semiconductor device 100 of one embodiment of the present invention in more detail. As shown in FIG. 2, there may be a length 202 that is substantially the same for the conductor 116 and dielectric layer 120. Prior to formation of the lateral undercuts 114, the metal gate 112 may also have a length 202 that is substantially the same as those of the conductor 116 and dielectric layer 120. The lateral undercuts 114 may reduce the length of the metal gate 112 in some embodiments. In other embodiments, the lateral undercuts 114 may leave small portions at the top and bottom of the metal gate 112 with substantially the same length 202 while reducing the length of the metal gate 112 more towards the center of the metal gate's thickness 206. The maximum distance between the edges of the metal gate 112 (at the top and bottom of the metal gate 112 in FIG. 2) is the maximum gate length. The minimum distance between the edges of the metal gate 112 (at the center of the metal gate's thickness 206 in FIG. 2) is the minimum gate length. Even in embodiments where small portions at the top and bottom of the metal gate 112 remain the same length as the lengths of the dielectric layer 120 and conductor 116, because the center of the metal gate 112 has a smaller length, the metal gate 112 will be considered to have an "effective length" less than the lengths of the dielectric layer 120 and conductor 116. In some embodiments, the effective length of the metal gate 112 is between the maximum and minimum gate lengths. In an embodiment, the metal gate 112 may have a maximum length of 30-35 nm, a minimum length of 25-30 nm and an effective length of 27-32 nm. In other embodiments, these lengths may be different.

The metal gate 112 may have a thickness 206. This thickness may be chosen to provide a desired work function and threshold voltage ($V_{Th}$) of the gate of the device 100. In an embodiment, the thickness 206 may between about 50 angstroms and about 200 angstroms. In other embodiments, the thickness may be greater than about 75 angstroms. In yet other embodiments, the thickness 206 may be different. The dielectric layer 120 may also have a thickness 204. In some embodiments, the dielectric layer 120 may have a thickness 204 less than about 25 angstroms, although in other embodiments the thickness 204 may be different.

The source/drain regions 108, 110 may each extend a distance 208 beneath the dielectric layer 120 and the metal gate 112 in some embodiments. The distance 208 is the distance between the outermost edge of the metal gate 112 and the furthest depth of the extension of the source/drain regions 108, 110 beneath the metal gate 112. The distance 210 may be considered the depth of the source/drain region 108, 110 extensions beneath the metal gate 112. The lateral undercuts 114 may extend a distance 210 from the outermost edge of the metal gate 112. The distance 210 is thus the distance between the outermost edge of the metal gate 112 and the greatest depth of the lateral undercut 114. The distance 210 may be considered the depth of the lateral undercuts 114. In an embodiment, the distance 208 may be greater than the distance 210. In an embodiment, the distance 210 may be between about one-quarter the distance 208 and about three-quarters of the distance 208. In another embodiment, the distance 210 may be about one-half the distance 208. In an embodiment, the distance 208 may be between about 10 nm and about 5 nm, and the distance 210 may be between about 7.5 nm and about 3.5 nm. In other embodiments, the distances 208, 210 may be different.

The lateral undercuts 114 in the metal gate 112 may reduce the vertical E-field between the metal gate 112 and the portions of the source/drain regions 108, 110 that extend under the dielectric layer 120. This reduction in vertical E-field may reduce the leakage current without necessitating increasing the thickness of the dielectric layer 120.

FIGS. 3 through 7 are cross sectional side views that illustrate how the device 100 of FIG. 1 may be formed, according to one embodiment of the current invention. In other embodiments, the device 100 may be formed differently.

Figure 3:
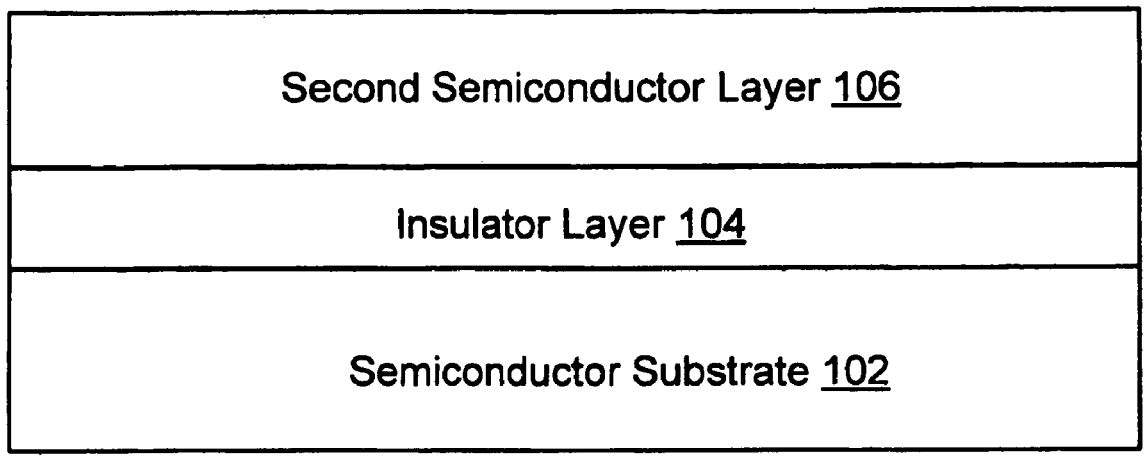
FIG. 3 is a cross sectional side view that illustrates a SOI substrate that may be used in the device.

FIG. 3 is a cross sectional side view that illustrates a SOI substrate that may be used in the device 100. As described above, the SOI substrate may include a semiconductor substrate layer 102, which may also be referred to as a first semiconductor layer 102. This semiconductor substrate 102 may comprise any suitable semiconductor material or materials, including silicon. On the semiconductor substrate 102 may be an insulating layer 104. The insulating layer 104 may comprise any suitable insulating material and may function to electrically isolate various devices formed on the substrate. In embodiments where the insulating layer 104 comprises an oxide, the insulating layer may also be referred to as a buried oxide layer. On the insulating layer 104 may be a second semiconductor layer 106. The second semiconductor layer 106 may comprise any suitable semiconductor material or materials, including silicon.

Figure 4:
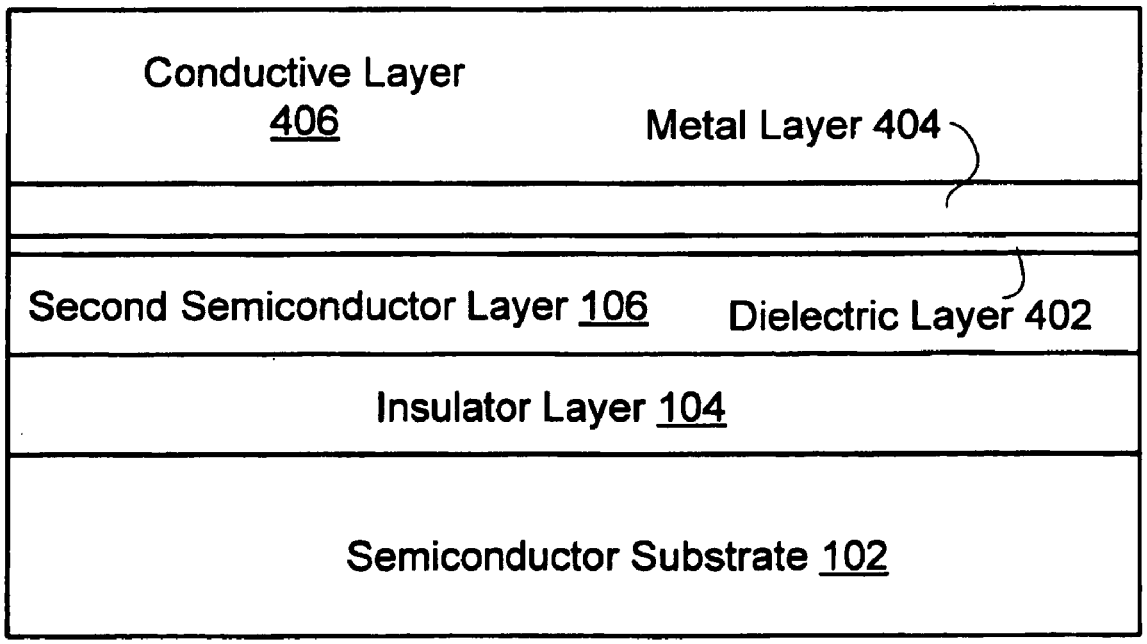
FIG. 4 is a cross sectional side view that illustrates the SOI substrate after a dielectric layer, metal layer, and conductive layer have been deposited.

FIG. 4 is a cross sectional side view that illustrates the SOI substrate after a dielectric layer 402, metal layer 404, and conductive layer 406 have been deposited, according to one embodiment of the present invention. The dielectric layer 402, metal layer 404, and conductive layer 406 may become the dielectric layer 120, metal gate 112, and conductor 116 shown in FIG. 1 after further processing.

The dielectric layer 402 may be a high-k dielectric layer in some embodiments. Such a high-k dielectric layer 402 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Although a few examples of materials that may be used to form the dielectric layer 402 are described here, the dielectric layer 402 may be made from other materials.

In one embodiment of the present invention, the dielectric layer 402 may be formed on the second semiconductor layer 106 by an atomic layer chemical vapor deposition ("ALCVD") process. In an ALCVD process, a growth cycle may be repeated until a dielectric layer 402 of a desired thickness is created. Such a growth cycle may comprise the following sequence in an embodiment. Steam is introduced into a CVD reactor for a selected pulse time, followed by a purging gas. A precursor (e.g., an organometallic compound, a metal chloride or other metal halide) is then pulsed into the reactor, followed by a second purge pulse. (A carrier gas that comprises nitrogen or another inert gas may be injected into the reactor at the same time.)

While operating the reactor at a selected pressure and maintaining the substrate at a selected temperature, steam, the purging gas, and the precursor may, in turn, be fed at selected flow rates into the reactor. By repeating this growth cycle—steam, purging gas, precursor, and purging gas—multiple times, one may create a dielectric layer 402 of a desired thickness on the second semiconductor layer 106. The pressure at which the reactor is operated, the gases' flow rates, and the temperature at which the substrate is maintained may be varied depending upon the application and the precursor that is used. The CVD reactor may be operated long enough to form the dielectric layer 402 with the desired thickness. The thickness 204 of the dielectric layer 120 of the device 100 may be substantially the same as the thickness of the dielectric layer 402 deposited on the second semiconductor layer 106. As discussed above, the dielectric layer 120 in the device 100 with lateral undercuts 114 may have a small thickness 204 and leakage current may still be at an acceptable level. This may allow scaling of device sizes and increased performance.

After forming the dielectric layer 402, the metal layer 404 may be formed on the dielectric layer 402. Metal layer 404 may be formed using conventional metal deposition processes, e.g., CVD or PVD processes, by using ALCVD, or another suitable method, and may comprise any conductive material from which metal gate electrodes may be derived. Materials that may be used to form n-type metal layers 404 (used in NMOS devices) include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten). Materials for forming p-type metal layers 404 (used in PMOS devices) include: ruthenium, palladium, platinum, cobalt, nickel, and conductive metal oxides, e.g., ruthenium oxide. Alternatively, a mid-gap metal gate material, e.g. stoichiometric titanium nitride or tantalum nitride, may be used in the metal layer 404 in some embodiments.

In some embodiments, metal layers 404 for NMOS devices may have a workfunction that is between about 3.9 eV and about 4.2 eV. In some embodiments, metal layers 404 for PMOS devices may have a workfunction that is between about 4.9 eV and about 5.2 eV. In some embodiments, metal layers 404 for mid-gap devices may have a workfunction between the workfunctions of NMOS and PMOS gate electrode materials.

A conductive layer 406 may be formed on the metal layer 404 in some embodiments. The conductive layer 406 may comprise any suitable conductive material, such as polysilicon, tungsten, aluminum, titanium, titanium nitride, or other materials or combinations of materials.

Figure 5:
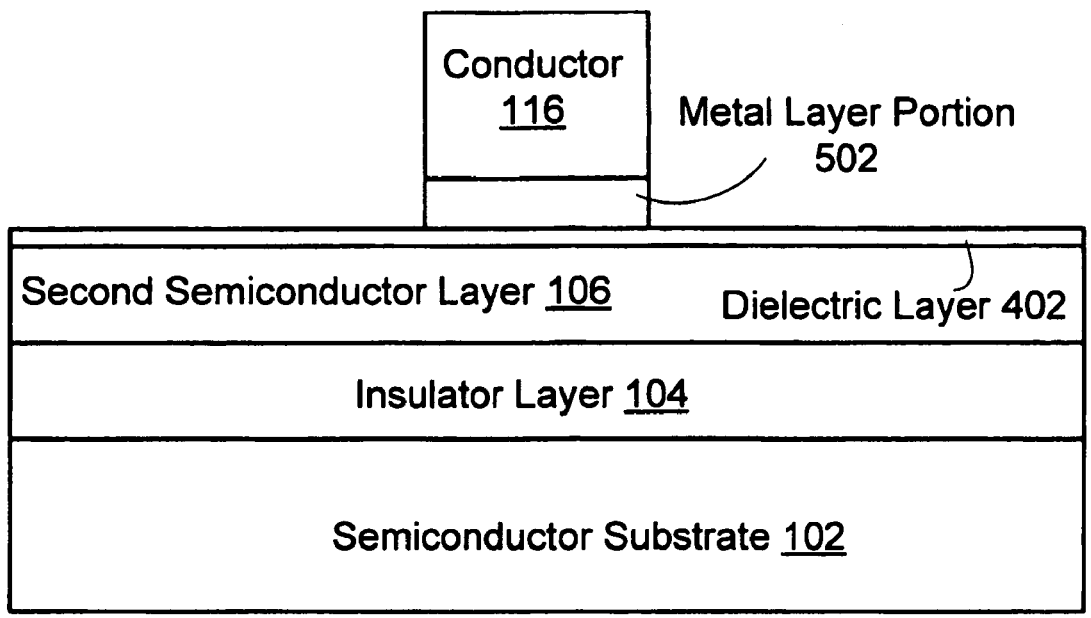
FIG. 5 is a cross sectional side view that illustrates the device after the conductive layer and metal layer have been patterned.

FIG. 5 is a cross sectional side view that illustrates the device 100 after the conductive layer 406 and metal layer 404 have been patterned, according to one embodiment of the present invention. Any suitable method may be used to pattern the conductive layer 406 to form the conductor 116 and to pattern the metal layer 404 to result in a metal layer portion 502. For example, the portions of the conductive layer 406 and metal layer 404 desired to remain in place may be protected by patterned photoresist and/or hardmask material and exposed portions of the conductive layer 406 and metal layer 404 removed by an etching procedure, such as a plasma-based dry etch.

Figure 6:
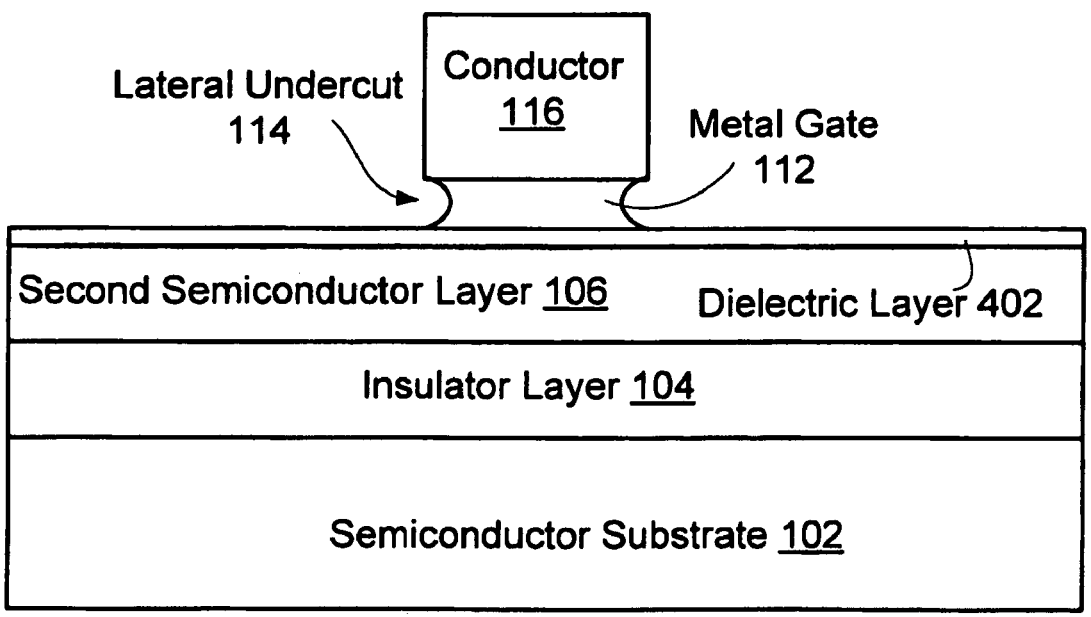
FIG. 6 is a cross sectional side view that illustrates the device after the metal layer portion has been etched to form lateral undercuts.

FIG. 6 is a cross sectional side view that illustrates the device 100 after the metal layer portion 502 has been etched to form lateral undercuts 114, resulting in the metal gate 112 of FIG. 1, according to one embodiment of the present invention. In an embodiment, the metal layer portion 502 may be selectively wet etched to form the lateral undercuts 114. In another embodiment, the metal layer portion 502 may be selectively etched by a combination wet and isotropic dry etch to form the lateral undercuts 114. In yet other embodiments, other methods may be used. As is discussed above, the lateral undercuts 114 may reduce the length of the metal gate 112.

Figure 7:
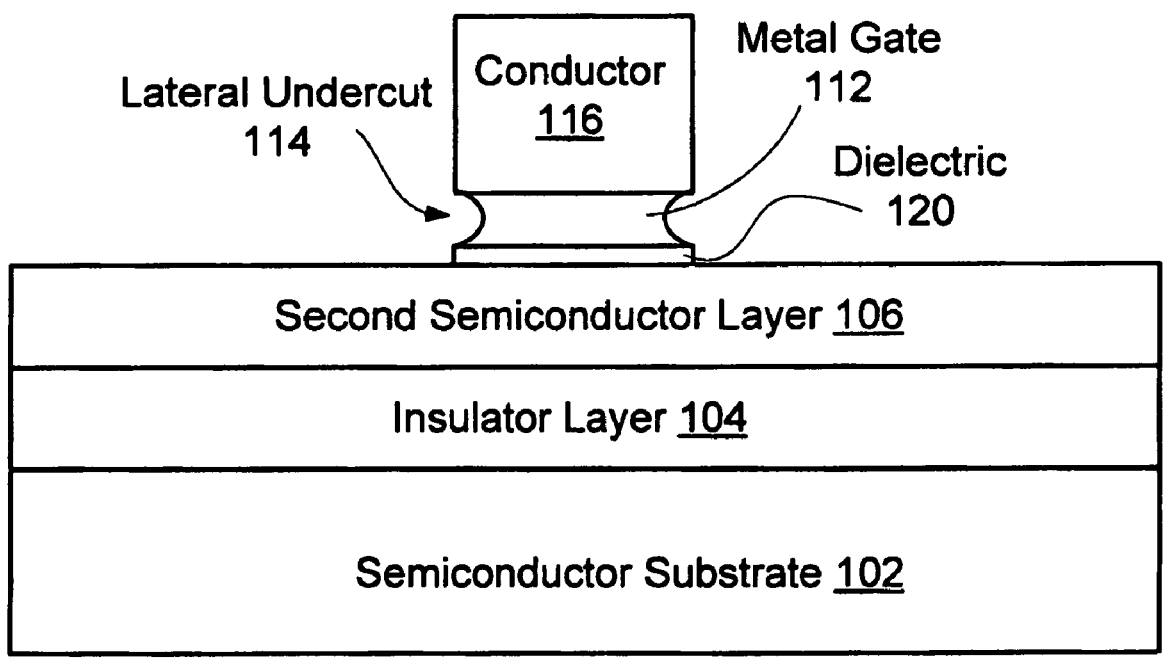
FIG. 7 is a cross sectional side view that illustrates the device after the dielectric layer is patterned to form the dielectric layer.

FIG. 7 is a cross sectional side view that illustrates the device 100 after the dielectric layer 402 is patterned to form the dielectric layer 120, according to one embodiment of the present invention. Any suitable method, such as a dry etch, may be used to remove the portions of the dielectric layer 402 that are not used as the dielectric layer 120.

In other embodiments, the dielectric layer 402 may be patterned prior to forming the lateral undercuts 114, rather than after. In such embodiments, care may be taken to avoid removing portions of the dielectric layer 402 while making the lateral undercuts 114; removal of portions of the dielectric layer 402 while making the lateral undercuts 114 could result in gate to source/drain shorts.

Additional processes may then be performed to result in the device 100 as illustrated in FIG. 1. For example, these additional processes may include formation of the spacers 118, doping of portions of the second semiconductor layer 106 to form source/drain regions 108, 110, addition of material to the second semiconductor layer 106 to form the raised portions on either side of the spacers 118 shown in FIG. 1, silicidation to form contacts, and other additional processes.

Figure 8:
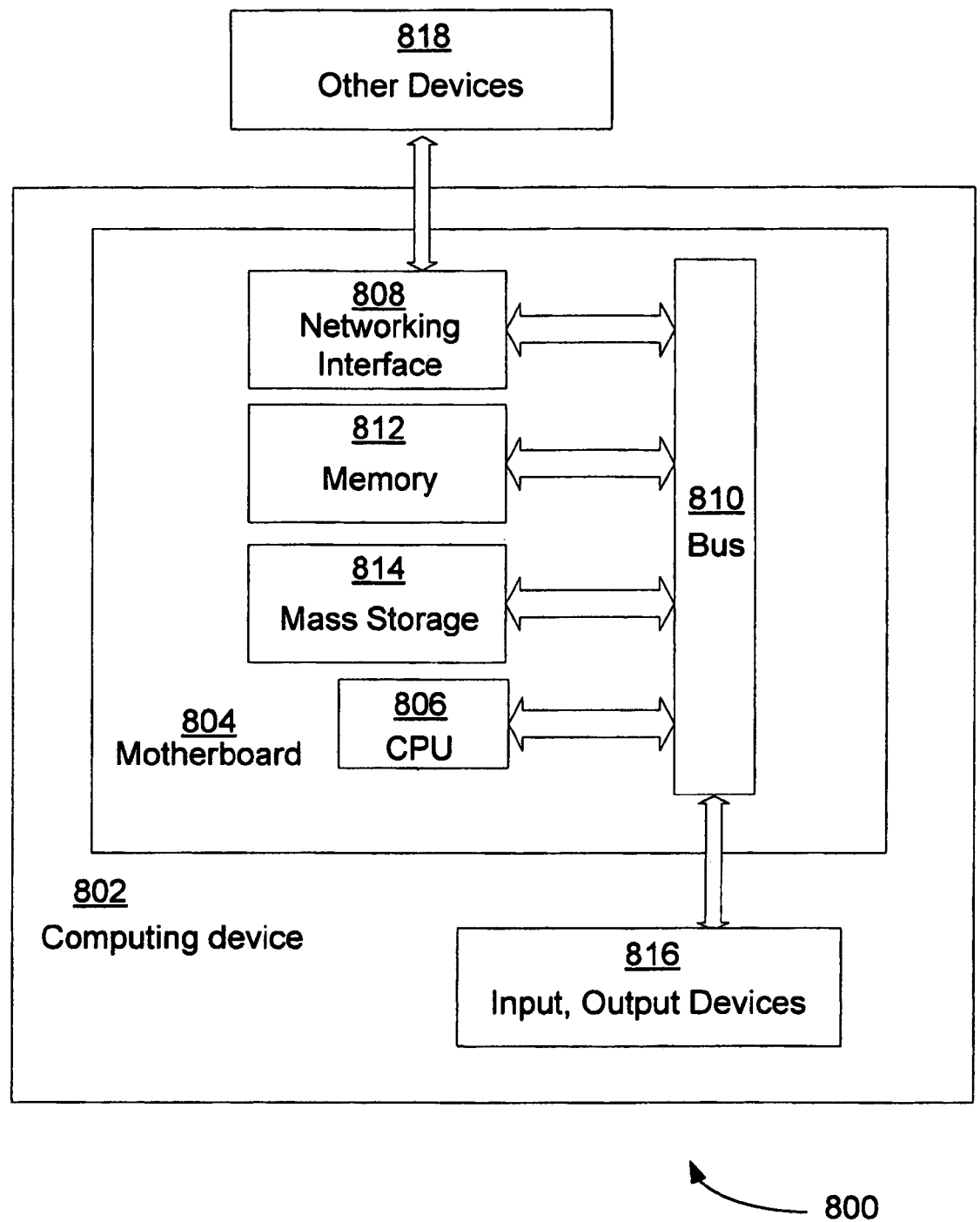
FIG. 8 illustrates a system in accordance with one embodiment of the present invention.

FIG. 8 illustrates a system 800 in accordance with one embodiment of the present invention. One or more devices 100 formed with lateral undercuts 114 as described above may be included in the system 800 of FIG. 8. As illustrated, for the embodiment, system 800 includes a computing device 802 for processing data. Computing device 802 may include a motherboard 804. Coupled to or part of the motherboard 804 may be in particular a processor 806, and a networking interface 808 coupled to a bus 810. A chipset may form part or all of the bus 810. The processor 806, chipset, and/or other parts of the system 800 may include one or more devices 100 formed with lateral undercuts 114.

Depending on the applications, system 800 may include other components, including but are not limited to volatile and non-volatile memory 812, a graphics processor (integrated with the motherboard 804 or connected to the motherboard as a separate removable component such as an AGP or PCI-E graphics processor), a digital signal processor, a crypto processor, mass storage 814 (such as hard disk, compact disk (CD), digital versatile disk (DVD) and so forth), input and/or output devices 816, and so forth.

In various embodiments, system 800 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 806, 814, etc. in FIG. 8 may include one or more devices 100 formed with lateral undercuts 114 as described herein. For example, a transistor formed with the lateral undercuts 114 may be part of the CPU 806, motherboard 804, graphics processor, digital signal processor, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method for making a semiconductor device, comprising:
    forming a gate dielectric on a second semiconductor layer on an insulator layer that is on a first semiconductor layer;
    forming a metal gate electrode on the gate dielectric, the metal gate electrode having a first side and a second side;
    removing portions of the metal gate electrode on the first side and the second side to form curved lateral undercuts extending into a center of the metal gates thickness and tapering off towards a top and a bottom surface of the metal gate said curved lateral undercuts having a depth laterally measured from an outermost edge of the metal gate to a greatest depth of the lateral undercut;
    forming source/drain regions of the second semiconductor layer on the first and second side of the metal gate electrode, the source/drain regions having extensions a distance beneath the metal gate electrode; and
    wherein the depth of the lateral undercuts are at least about one-fourth the distance of the source/drain region extensions.

2. The method of claim 1, wherein forming said gate dielectric and said metal gate electrode are formed by a metal comprising:
    forming a layer of dielectric material on the second semiconductor layer;
    forming a metal layer on the layer of dielectric material;
    removing portions of the metal layer to leave behind the metal gate electrode; and
    removing portions of the layer of dielectric material to leave behind the gate dielectric.

3. The method of claim 2, further comprising:
    determining a desired threshold voltage for the semiconductor device;
    determining a thickness of the metal gate electrode that results in the desired threshold voltage; and
    wherein forming a metal layer on the layer of dielectric material comprises forming the metal layer with a thickness about equal to the thickness of the metal gate electrode that results in the desired threshold voltage.

4. The method of claim 2, wherein the layer of dielectric material comprises a high-k dielectric material and wherein the metal layer on the layer of dielectric material comprises a material selected from the group consisting of a p-type metal, an n-type metal, and a mid-gap metal.

* * * * *